United States Patent [19]

Kuni et al.

[11] Patent Number: 4,556,797

[45] Date of Patent: Dec. 3, 1985

[54] METHOD AND APPARATUS FOR DETECTING EDGE OF FINE PATTERN ON SPECIMEN

[75] Inventors: Asahiro Kuni, Tokyo; Toshimitsu Hamada, Yokohama; Hiroshi Makihira, Yokohama; Kazushi Yoshimura, Yokohama, all of Japan

[73] Assignee: Hitachi, Ltd., Tokyo, Japan

[21] Appl. No.: 530,044

[22] Filed: Sep. 7, 1983

[30] Foreign Application Priority Data

Sep. 9, 1982 [JP] Japan ................................. 57-155811

[51] Int. Cl.⁴ ............................................. H01J 37/00
[52] U.S. Cl. ................................................. 250/492.2
[58] Field of Search .................. 250/492.2, 358, 491.1; 219/121 EB, 121 EM

[56] References Cited

U.S. PATENT DOCUMENTS 3,875,415 4/1975 Woodard ......................... 250/492.2
3,901,814 8/1975 Davis et al. ...................... 250/492.2

Primary Examiner—Bruce C. Anderson
Attorney, Agent, or Firm—Antonelli, Terry & Wands

[57] ABSTRACT

In a method and apparatus for detecting the edge of a fine pattern formed on a specimen such as a fine circuit pattern formed on a semiconductor element or the like, there is prepared a predetermined model waveform based on theoretical secondary electron emission from the edge portion. Secondary electrons emitted from successive scanning points across the pattern edge portion through the irradiation of a scanning electron beam thereonto are detected to produce an actual signal waveform reflecting the secondary electron emission from the pattern edge portion. The actual signal waveform is compared with the model waveform, and one of the scanning points at which the highest coincidence exists between both the actual and model waveforms, is determined as a position of the pattern edge.

3 Claims, 8 Drawing Figures

FIG. I
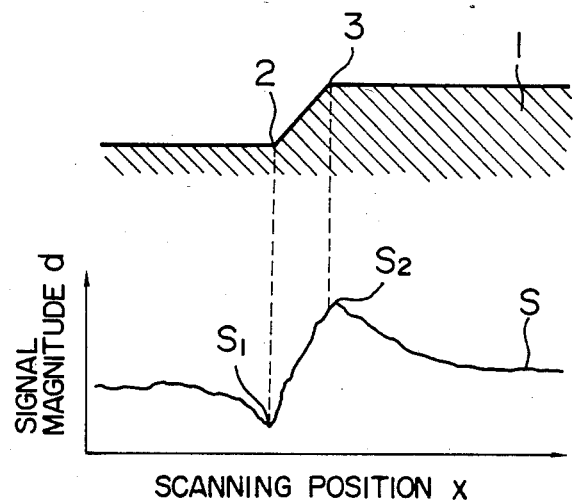
FIG. 2
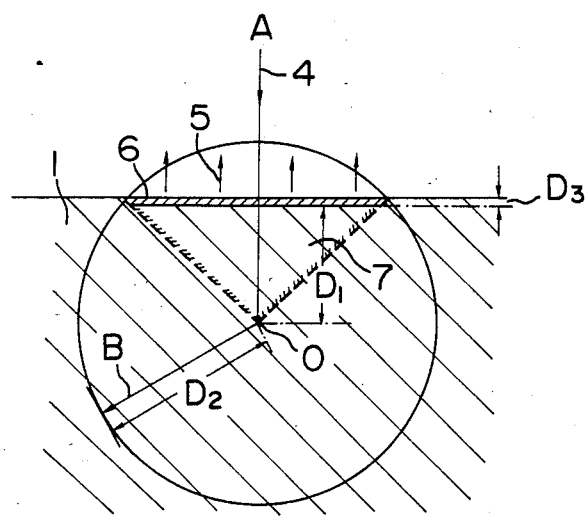

METHOD AND APPARATUS FOR DETECTING EDGE OF FINE PATTERN ON SPECIMEN

BACKGROUND OF THE INVENTION

The present invention relates to a method and apparatus for detecting accurately the edge of a fine pattern on a specimen (e.g. a fine circuit pattern formed on a semiconductor device) by means of a scanning electron microscope.

The edges of fine circuit patterns formed on semiconductor devices are detected using a scanning electron microscope (SEM). The SEM projects an electron beam on to an edge portion of the pattern to detect a reflected version thereof. By processing the detected signal, the presence of the edge is detected and its feature is evaluated. An example of detecting the edge position and measuring the width of the edge portion is disclosed in Japanese Patent Application No. 56-61604. In this method, a circuit pattern is magnified on the CRT screen of an SEM, and the edge position and width are detected visually by placing a cursor on the image.

The method will be described in further detail in the following. A pair of cursors are composed electrically on the magnified image of a circuit pattern and the position of the cursors is adjusted by turning the knobs of potentiometers or the like. An operator places one cursor over the left edge of the pattern and another cursor over the right edge of the pattern while turning the knobs of the cursors. Then, the operator reads the difference of readings on the potentiometer dials as the distance of two cursors, and evaluates the actual pattern width by the calibration based on the magnification factor. Although this method is simple, the accuracy of measurement largely depends on the operator's skill, and the positioning of the cursors over the pattern edge easily may cause an error when the circuit pattern does not have a sharp edge.

Recognition of edges of a circuit pattern on the two-dimensional image on the CRT screen by human visual observation and alignment of the cursors with the edges depend largely on the contrast in the SEM image signal as shown in FIG. 1. The figure shows the waveform of a signal produced when the electron beam spot makes a scanning pass across the edge of a circuit pattern (i.e., the signal corresponds to a scanning line in the two-dimensional raster image). The circuit pattern is assumed to have an edge portion having in its cross section 1 a concave corner line 2 and a convex corner line 3. Scanning of this portion by the electron beam produces a signal shown as waveform S on a plane with its abscissa representing the scanning position x and its ordinate representing the magnitude d of the signal. The signal has a minimum peak $S_1$ at the concave corner line 2 and a maximum peak $S_2$ at the convex corner line 3, thereby resulting in the creation of a dark line at the concave corner line on the left of the slant of the edge and a bright line at the convex corner line on the right of the slant in the two-dimensional image. In measuring the pattern width, an operator places the cursors over the bright and dark lines (for measuring the bottom width of a pattern, two cursors are placed over dark lines on both side of the pattern, or for measuring the pattern width at its top flat portion, the cursors are placed over the bright lines).

The signal waveform S of FIG. 1 suggests that the positions of the edge corner lines can be accurately detected by detecting positions providing the maximum and minimum peaks of the signal. However, noises are included in the signal from the SEM. On this account, because the simple peak value detection can easily invite a detection error, and also because coincidence of the position of the peaks with the corner lines is not guaranteed although they qualitatively have the relationship as shown in FIG. 1, the detection error is unavoidable for a possible automatic detection system. The detection error is large relative to the resolution of the SEM, posing a difficult problem in the attempt to detect the edge position accurately using an SEM.

SUMMARY OF THE INVENTION

It is an object of the present invention to provide a method and apparatus for automatically detecting the edge position of a pattern by use of a scanning electron microscope.

In order to correlate the signal waveform with the actual edge shape, the present invention uses a model waveform which is determined theoretically in advance by using a model of secondary electron emission with the mutual action of a sample material and an electron beam taken into consideration. The model waveform is compared with an actual scanning waveform produced by a scanning electron beam and the edge position is determined by estimating the correlation or coincidence of both the waveforms.

BRIEF DESCRIPTION OF THE DRAWINGS

FIG. 1 is an illustration showing the cross section of the edge portion of a pattern and a signal produced by the scanning electron microscope;

FIG. 2 is a diagram explaining a theoretical model of secondary electron emission;

DESCRIPTION OF THE PREFERRED EMBODIMENTS

In SEM technology, it is relatively easy to presume how the number of secondary electrons emitted from a specimen irradiated by an electron beam is affected by the shape of the specimen surface (or an inclination thereof with respect to an incident beam), and thus to determine the signal waveform at the pattern edge portion. In the case of an optical system in which a small laser spot is used to scan the specimen, concentration of a laser beam into a spot at a large solid angle causes the scattered light to disperse in a wide range, and a part thereof is received by a detector after a repetition of secondary reflection and transmission in the pattern material (when the pattern is formed of a transparent material). On this account, such a complicated light path involving reflectivity, transmittance and refractivity of materials makes it unfeasible to obtain a theoretical presumption of the signal waveform. On the other hand, the scanning electron microscope uses a very thin needle-like electron beam to scan the specimen, and most of secondary electrons emitted from the specimen can be captured. Accordingly, if a proper model of secondary electron emission is available, the signal waveform can be readily presumed theoretically.

There is known, for example, the Archard Model as disclosed in an article of G. D. Archard entitled "Back Scattering of Electrons", J. Appl. Phys., Vol. 32, No. 8, Aug. 1981, pp. 1505-1509. This model is briefly depicted in FIG. 2.

Referring to FIG. 2, which shows the cross section 1 of a specimen, an electron beam 4 enters the specimen in the direction shown by arrow A. The electron beam 4 impinges on atoms of the specimen many times while kicking out secondary electrons and reflection electrons, and the beam changes its propagation direction. When the electron beam goes into the specimen beyond a certain depth (diffusion depth $D_1$), it can take any propagating direction in a sense of probability. The figure shows the case where the electron beam which has entered the specimen in the direction of arrow A goes next in the direction of arrow B. On the other hand, there is a limit of depth for electrons to penetrate into a material (i.e., penetration depth D). Assuming a sphere having a radius $D_2$ equal to the penetration depth $D (=D_1+D_2)$ subtracted by the diffusion depth $D_1$ and having its center located at a position 0 at the level of the diffusion depth, all electrons of the incident electron beam 4 will stop within the sphere. Therefore, only electrons located inside a cone 7 defined by a dashed line can go out through the surface into the vacuum space. This is the Archard Model disclosed in the above-mentioned article, in which the author discusses the value of the back scattering factor of materials based on the size of the cone 7 and shows that the theoretical value well matches with the experimental value.

Figure 3:
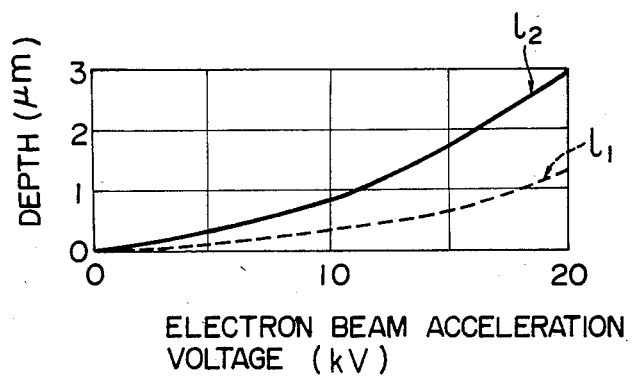
FIG. 3 is a graph showing the relationship between the electron beam acceleration voltage and the depth of electron beam penetration.

Secondary electrons 5 are created by the impingement of diffusion electrons onto atoms of a thin layer (having a depth of $D_3$) near the surface. Accordingly, the amount of secondary electrons created is proportional to the area of cross section 6 of the layer. On this account, by tracing the change in the area when the sphere is moved along an assumed shape on the specimen surface, the secondary electron signal can be presumed. The diffusion depth $D_1$ and penetration depth D are known theoretically and experimentally for arbitrary atomic number and acceleration voltage as shown in FIG. 3, where the depths in $\mu$m are plotted on the ordinate against the beam acceleration voltage in kV on the abscissa. The graph showing the characteristics $l_1$ of the diffusion depth $D_1$ and the characteristics $l_2$ of the penetration depth D for silicon reveals that the depths $D_1$ and D increase as the acceleration voltage is increased. Materials used for semiconductor devices have atomic numbers around that of silicon, and thus they have the characteristics similar to those of FIG. 3.

Figure 4:
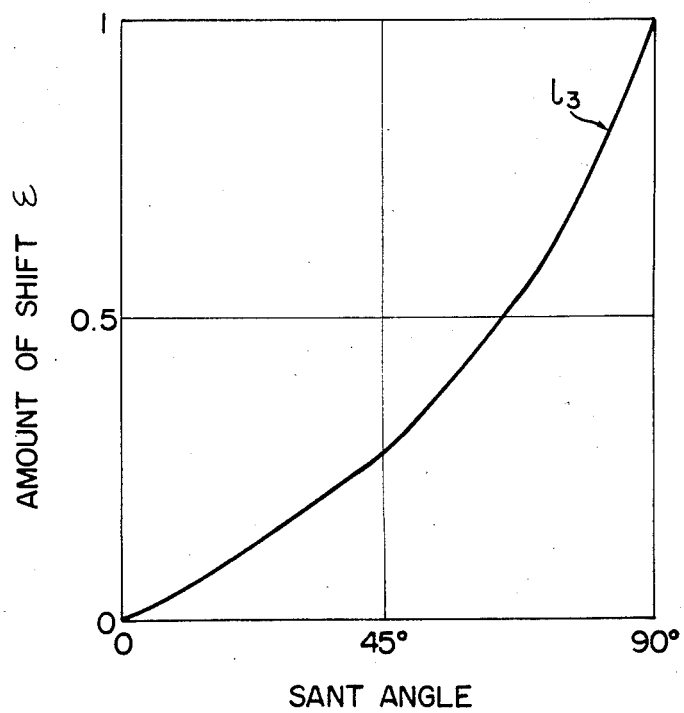
FIG. 4 is a graph showing the relationship between the slant angle and the amount of shift in the detected signal.

The theoretical signal waveform computed on 1 the basis of this model highly matches the actual signal waveform S shown in FIG. 1. However, there is a shift between the maximum and minimum peaks of the signal and the positions of the corner lines of the edge to an extent depending on the diameter of the incident electron beam and the shape of the edge. The characteristics of the shift are shown in FIG. 4, where the amount of shift $\epsilon$ normalized by the beam diameter is plotted on the ordinate against the slant angle of the edge (the slant frame corner line 2 to corner line 3 in FIG. 1) on the abscissa. The characteristic curve $l_3$ indicates that the amount of shift $\epsilon$ increases as the slant angle increases, no shift results at a slant angle of 0°, and at a slant angle of 90° the shift $\epsilon$ reaches 1, i.e., as large as the beam diameter. In general, standardized circuit patterns are formed in semiconductor devices, and therefore, they are presumed to have edges of substantially the same slant angle. The relationship between the slant angle and the shift value $\epsilon$ in accordance with the graph of FIG. 4 is set in the memory in advance, so that the shift value $\epsilon$ for each type of pattern is read out for correction. In regard to the direction of the shift, an increased beam diameter causes the minimum peak $S_1$ to shift left, while a decreased beam diameter causes a right shift. Whereas, an increased beam diameter causes the maximum peak $S_2$ to shift right, while a decreased beam diameter causes a left shift. Consequently, an increase in the beam diameter results in an increase in the distance between the minimum peak $S_1$ and the maximum peak $S_2$ on the x axis, and conversely, a decrease in the beam diameter results in a decrease in the distance between these peaks.

Figure 5:
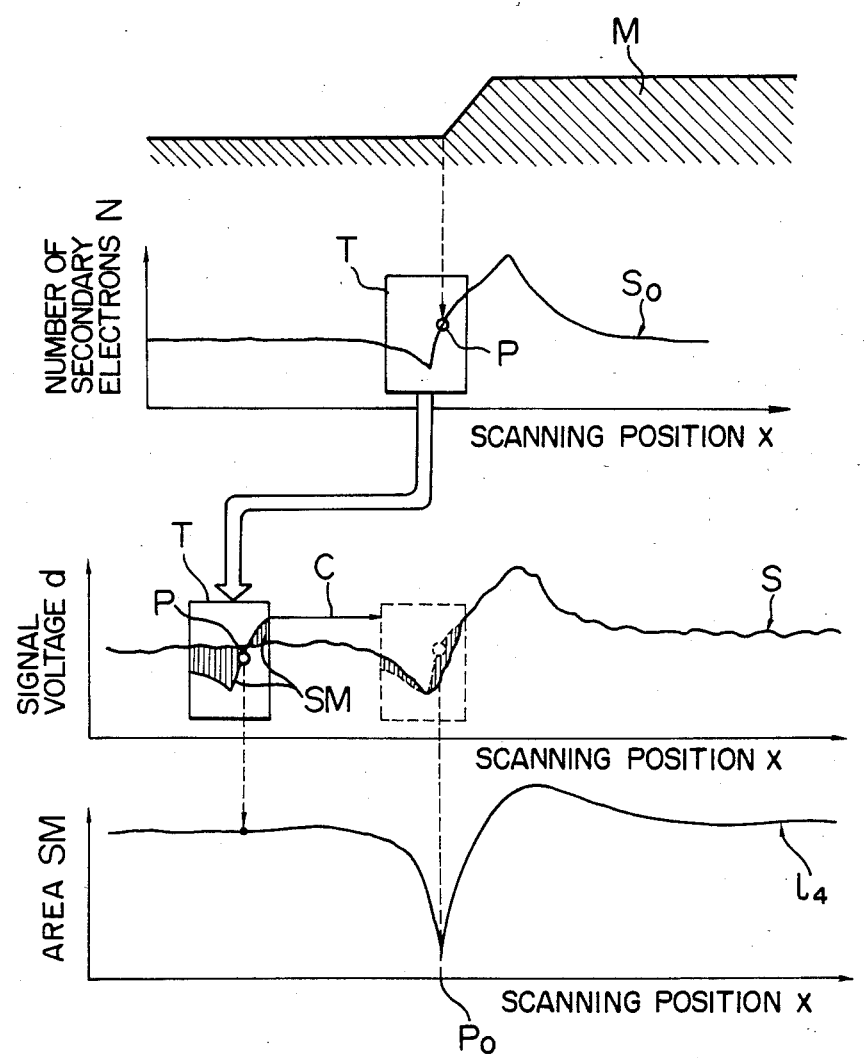
FIG. 5 is a set of illustrations explaining the method of detecting the edge position according to the present invention.

FIG. 5 is a set of diagrams showing the concept of the inventive method for detecting the corner lines of the edge at a high repeat accuracy using the SEM image signal having the foregoing characteristics.

A theoretical signal waveform S is obtained by application of the Archard Model to a model pattern M simulating the cross section 1 of the actual pattern. The signal represents the number of secondary electrons, N, plotted on the ordinate against the beam scanning position x across the edge of the pattern on the abscissa. Considering now the case of detecting the concave corner line position of the edge, this position on the model M is known to be position P from the process of obtaining the signal waveform $S_0$. The position P is shifted from the minimum peak by the amount defined in FIG. 4. A characteristic region of the signal around the position P is cut out to make a template T. On the other hand, a signal waveform S of secondary electrons is obtained when the edge portion of the circuit pattern is actually scanned by the electron beam. The signal voltage d is plotted on the ordinate against the actual beam scanning position x on the abscissa. The template T is laid over the signal waveform S to obtain the difference of both waveforms, particularly, the area SM of the hatched portions. A new graph is drawn, on which is plotted the area SM on the ordinate at the point on the abscissa corresponding to the point P of the template, against the beam scanning position x on the abscissa. This operation is repeated by moving the template T in the direction of arrow C, and there will be obtained a curve $l_4$ showing the degree of inconsistency between the actual signal waveform S from the SEM and the characteristic waveform around the concave corner of the edge taken from the theoretical signal waveform $S_0$. The lowest point P of the characteristics $l_4$ indicates the true position of the concave corner line. Accordingly, by detecting the lowest point on the characteristic curve, the edge position can be detected accurately in consideration of the correction for the shift shown in FIG. 4.

Figure 6:
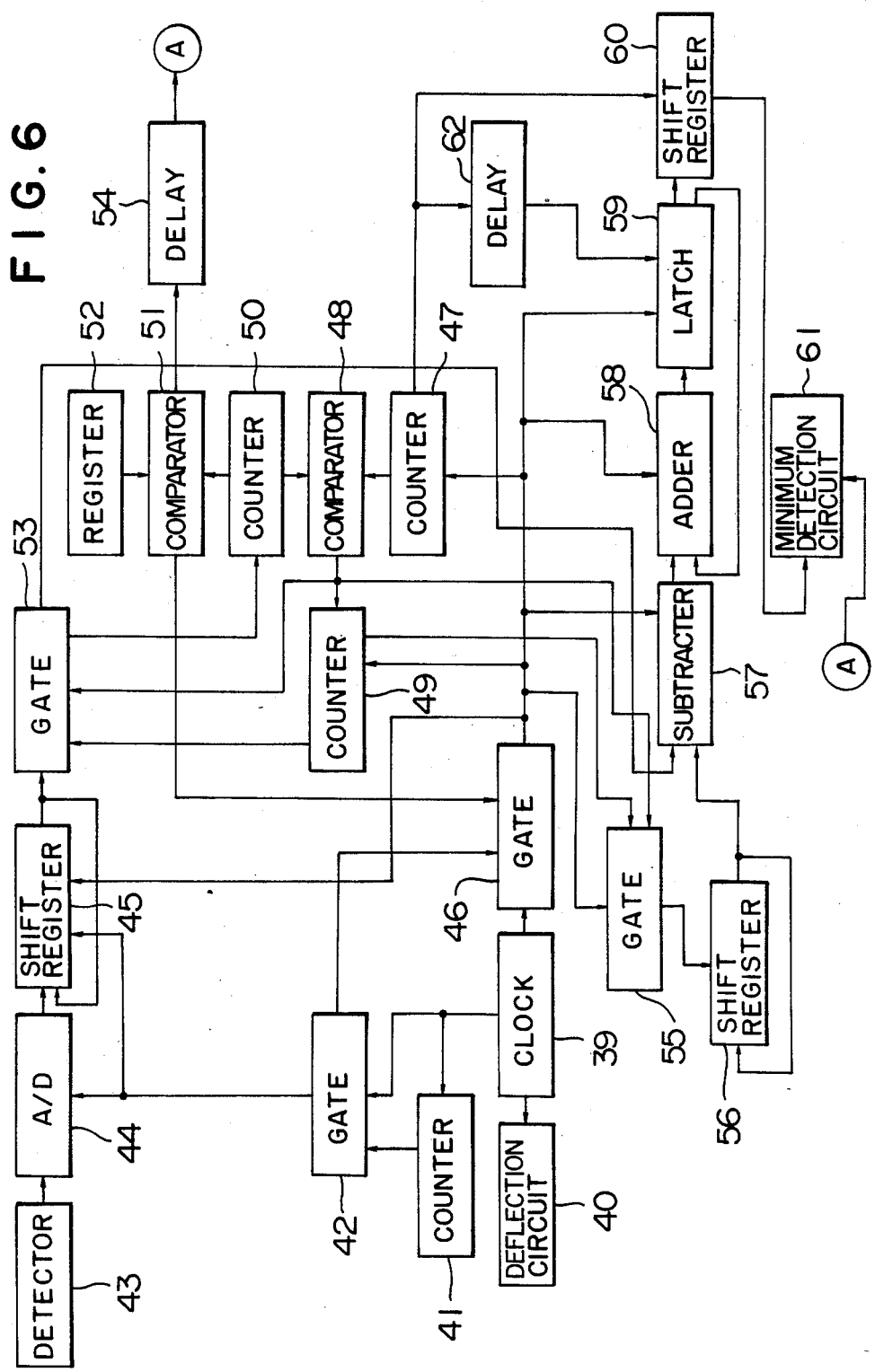
FIG. 6 is a block diagram showing the circuit arrangement embodying the present invention.

FIG. 6 shows the circuit arrangement for carrying out the concept described above.

In the following discussion, the number of samples (picture elements) in the electron beam scanning range is assumed to be m, and the number of picture elements in the template is assumed to be n, where m>n.

A clock generator 39 provides clock pulses for an electron beam deflection circuit 40, which deflects the beam in accordance with the number of clock pulses received so that the electron beam 1 projected onto the specimen scans the circuit pattern across its edge portion. The same clock pulses are supplied through a gate 42 to an A/D converter 44 which converts the signal from a secondary electron detector 43 into a digital signal, and the signal is loaded into a shift register 45 in synchronization with the clock. The shift register 45 can store m picture elements. Also provided on the path of the clock is a counter 41 in which the value of m is set. The gate 42 and the counter 41 are initialized externally to the enabled states and cleared state, respectively. Initially, the gate 42 conducts clock pulses, but when the counter 41 counts clock pulses to the value of m, it disables the gate 42 to cut off clock pulses to the A/D converter 44 and the shift register 45. In consequence, the values of the input signal obtained when the electron beam scans the specimen surface are stored in the shift register 45.

The signal for disabling the gate 42 is used to enable a gate 46, and clock pulses are supplied to the shift register 45 and to a shift register 56 which stores n elements of template data. Both data are conducted to a subtracter 57 sequentially in response to clock pulses, and the difference between the actual signal and the template data is computed. Namely, the difference between the initial value of the shift register 45 (the value of the input signal at the starting point of scanning) and the initial value of the shift register 56 (the first value of the template data) is evaluated as an absolute value, and it is conducted to an adder 58, which adds the contents of a latch 59 to the input value and loads the latch 59 with the result. Since the latch 59 has been cleared by initialization, the first result of addition is equal to the absolute value from the subtracter 57. When another clock pulse is given, the second values of the shift registers 45 and 56 are supplied to the subtracter 57, and the resultant absolute value is added to the contents of the latch 59 by the adder 58, then the latch 59 is updated by the result. In this way, the difference between the actual signal and the template data is accumulated in the latch 59.

A counter 47 counts clock pulses and, when the count reaches a preset value of m, it is cleared automatically to zero. A counter 50 is cleared by external initialization, and arranged to increment the contents each time a gate 53 is disabled. A comparator 48 compares the contents of the counter 47 and 50, and issues the count start signal to a counter 49 and the enable signal to the gate 53 and the gate 55 when both inputs coincide with each other. The counter 49 starts to count clock pulses in response to the signal from the comparator 48 and, when the count reaches a preset value of n, issues the disable signal to the gates 53 and 55, and then it is cleared to zero automatically.

When the gate 46 is enabled to supply the first clock pulse, while the counters 47 and 50 contain zero at this time, the comparator 48 issues the count start signal to the counter 49 and the enable signal to the gates 53 and 55. Then, the first values of the shift registers 45 and 56 are supplied to the subtracter 57 in response to the clock pulse, and the counters 47 and 49 count that clock pulse. This operation is repeated until the n-th clock pulse is reached when the counter 49 with its count equal to n disables the gates 53 and 55, and then it is cleared by itself. Accordingly, even if more clock pulses are supplied, the contents of the shift register 45 does not reach the subtracter 57 and the shift register 56 halts the operation. At this time, the shift register has just made a rotation and has the initial value again. After more clock pulses have been supplied to a total of m, the counter 47 reaches m, and the contents of the latch 59 are transferred to a shift register 60 in response to the write signal issued by the counter 47. Then, the latch 59 is cleared by the write signal via a delay circuit 62.

Through these operations, data representing the difference between the actual and theoretical signal waveforms obtained when the template is laid over the left end of the input signal in FIG. 5 is loaded into the shift register 60.

The next operation is to move the template by the value of one picture element, so that the difference of the signal waveforms at the new position is obtained.

When the counter 47 reaches m, the shift register 45 completes a rotation and returns to the initial state. Then, the counter 47 is cleared automatically and starts to count clock pulses again. At this time, the gates 53 and 55 are still disabled, and when the first clock pulse provides a picture element for the shift register 45, its output is blocked by the gate 53. The shift register 56 does not receive clock pulses and therefore does not operate.

The counter 50 has counted the event of disabling the gate 53, and has a count of 1. Accordingly, when the first clock arrives at the counter 47, it counts 1, causing the comparator 48 to issue the enable signal, then the gates 53 and 55 are enabled. Consequently, the subtracter 57 receives the contents of the shift registers 45 and 56 in response to clock pulses following the first one. The subtracter 57 receives the second picture element from the shift register 45 and the first picture element from the shift register 56, and in this way subtraction between a picture element from one source and a preceding picture element from another source, takes place. This produces the operation of taking the difference between the waveform derived from the input signal and that of the template which has been shifted by one picture element on the input waveform.

When the counter 49 reaches n, the shift register 56 halts the rotation, the gate 53 is disabled, then the counter 50 increments to 2. When the counter 47 reaches m, the contents of the latch 59 are stored in the shift register 60 with its address shifted by one. In this way, the differences of waveforms obtained by shifting the template on the input signal waveform by one picture element each time are stored sequentially in the shift register 60.

A register 52 has a preset value of m-n-1, and it is compared with the contents of the counter 50 by a comparator 51 which, when the inputs coincide with each other, issues a disable signal to the gate 46 to cut off the clock, and the operation for obtaining the difference between the waveforms of the input signal and template is completed. At the same time, the comparator 51 issues a completion signal which, through a delay circuit 54, turns to the start signal for a minimum value detection circuit 61. The circuit 61 receives the contents of the shift register 60 sequentially to detect the minimum value and its address, so as to determine the position where the input signal waveform most correlate with the template.

The measurement result according to this embodiment shows that the corner line position of the edge of a pattern can be detected in the secondary electron signal from the SEM at an accuracy higher than 0.05 μm. It has been confirmed that the practice of this embodiment has significantly improved the accuracy of measuring dimensions of fine patterns on a semiconductor device and the like.

Figure 7:
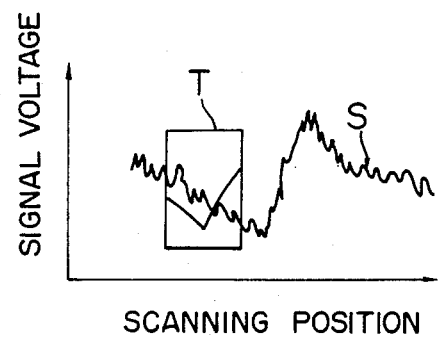
FIGS. 7 and 8 are diagrams demonstrating the present invention.

FIG. 7 shows an example of the input signal S which includes many random noises. The inventive method and arrangement allow accurate detection of the edge position for such a noisy signal. This is because the template T includes information of a wide range, and because noises in the input signal are averaged based on the fact that the input signal under test includes information of a range as wide as that of the template.

Figure 8:
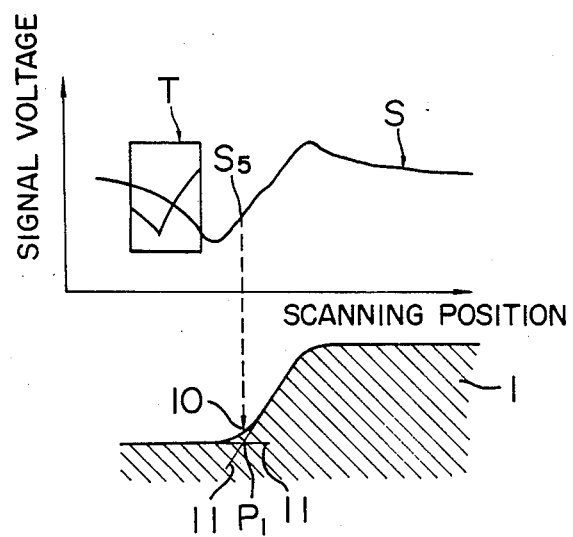

FIG. 8 shows the edge of a pattern having a round corner 10, that results in a round minimum peak $S_5$. However, the accurate corner position $P_1$ can be found in a sense of extrapolation for the profiles 11 on both sides using information around the corner of the template T, thereby allowing accurate detection of the edge position.

Although the embodiment of FIG. 6 is the arrangement based on a hardware design, it is also possible to realize the method using a microcomputer and software technology. According to the present invention, wherein a model of the signal waveform for the edge of a pattern is prepared and the actual signal waveform produced by the SEM is compared with the model, high-accuracy detection for the edge position of fine patterns is made possible.

We claim:

1. A method of detecting the edge of a fine circuit pattern formed on a semiconductor device, comprising the steps of:
   storing a model wave form signal representing the estimated amount of secondary electrons to be obtained at each scanning position on a line intersecting the edge of said circuit pattern along which an electron beam is to be scanned, said model wave form signal being determined on the basis of the material of the circuit pattern, a cross section of the circuit pattern, the acceleration voltage of the electron beam which is to scan the circuit pattern and the diameter of the electron beam;
   projecting an electron beam from an electron lens system onto successive scanning points along said scanning line extending at least across the edge portion of said fine circuit pattern;
   sequentially detecting secondary electrons emitted from each of the scanning positions on the scanning line resulting from the irradiation of said circuit pattern by said electron beam and storing an actual wave form signal representing the amount of detected secondary electrons at each said scanning position; and
   comparing said actual wave form signal and said model wave form signal while shifting the model wave form signal with respect to the actual wave form signal in the direction of said scanning, thereby obtaining a measure of the degree of inconsistency between the actual wave form signal and the model wave form signal for each point on the actual waveform signal to detect a position representing the position of the edge along the scanning point direction on the basis of a designated position in said model wave form signal when the highest coincidence exists between the actual waveform signal and said model waveform signal.

2. An apparatus for detecting the edge of a fine pattern formed on a semiconductor device, comprising:
   first memory means for storing a model waveform signal representing the estimated amount of secondary electrons to be obtained at each scanning position on a line intersecting an edge of said circuit pattern along which an electron beam is to be scanned, said model waveform signal being determined on the basis of the material of the circuit pattern, a cross section of the circuit pattern, the acceleration voltage of the electron beam which is to scan the circuit pattern, and the electron beam diameter;
   an electron lens system for projecting an electron beam onto successive scanning points along said scanning line extending at least across the edge portion of said fine circuit pattern;
   a secondary electron detector for sequentially detecting secondary electrons emitted from the scanning positions on said scanning line due to irradiation of said circuit pattern by said electron beam;
   second memory means for storing an actual waveform signal representing the amount of detected secondary electrons for each scanning position as detected by said secondary electron detector;
   means for producing a signal representative of the difference between said actual waveform signal and said model waveform signal by comparing these signals while shifting the model waveform signal from said first memory means with respect to the actual waveform signal from said second memory means in the direction of the scanning point during successive comparison operations; and
   means for analyzing said difference signal from said difference signal producing means to detect as a position of said edge one of the scanning points in said actual waveform signal which corresponds to a designated scanning point in said model wave form signal when said difference signal has a minimum value.

3. An apparatus according to claim 2, wherein said difference signal producing means comprises a subtractor for receiving for each comparison operation the successive scanning position values of said actual waveform signal and said model waveform signal, and an adder for adding the output of said subtractor to the content of a latch which is connected to receive the output of said adder for each position of the model waveform signal.

* * * * *